(12) United States Patent
Kato

(10) Patent No.: US 7,789,019 B2
(45) Date of Patent: Sep. 7, 2010

(54) OVERHEAD TRAVELING VEHICLE SYSTEM AND CONSTRUCTION METHOD OF BUFFER IN THE SYSTEM

(75) Inventor: Susumu Kato, Inuyama (JP)

(73) Assignee: Murata Machinery, Ltd., Kyoto (JP)

( * ) Notice: Subject to any disclaimer, the term of this patent is extended or adjusted under 35 U.S.C. 154(b) by 0 days.

(21) Appl. No.: 12/264,929

(22) Filed: Nov. 5, 2008

(65) Prior Publication Data

US 2009/0120320 A1 May 14, 2009

(30) Foreign Application Priority Data

Nov. 13, 2007 (JP) ............... 2007-294579

(51) Int. Cl.
*E01B 25/22* (2006.01)
(52) U.S. Cl. ..................... 104/111; 104/89
(58) Field of Classification Search ............ 104/89, 104/111
See application file for complete search history.

(56) References Cited

U.S. PATENT DOCUMENTS 6,183,184 B1   2/2001  Shiwaku
7,578,240 B2 *  8/2009  Shiwaku ................. 104/89
2006/0222479 A1* 10/2006  Shiwaku et al. ........... 414/267
2008/0168920 A1*  7/2008  Nakashima et al. ....... 104/124

FOREIGN PATENT DOCUMENTS

| EP | 1 707 507 A1 | 10/2006 |
| JP | 62-070842 U | 5/1987 |
| JP | 09-150918 A | 6/1997 |
| JP | 10-109887 A | 4/1998 |
| JP | 11-236187 A | 8/1999 |
| JP | 2006-282303 A | 10/2006 |
| JP | 2006-324469 A | 11/2006 |
| WO | 2004/034438 A2 | 4/2004 |

OTHER PUBLICATIONS

Official Communication issued in corresponding Japanese Patent Application No. 2007-294579, mailed on Sep. 16, 2009.
Official Communication issued in corresponding European Patent Application No. 08018794.1, mailed on Mar. 25, 2010.

* cited by examiner

*Primary Examiner*—S. Joseph Morano
*Assistant Examiner*—Zachary Kuhfuss
(74) *Attorney, Agent, or Firm*—Keating & Bennett, LLP

(57) ABSTRACT

An overhead traveling vehicle system includes traveling rails that are hung parallel or substantially parallel to each other from a ceiling while being spaced from each other. A side buffer is disposed between the traveling rails and supported by the opposing traveling rails.

3 Claims, 6 Drawing Sheets

F I G. 1
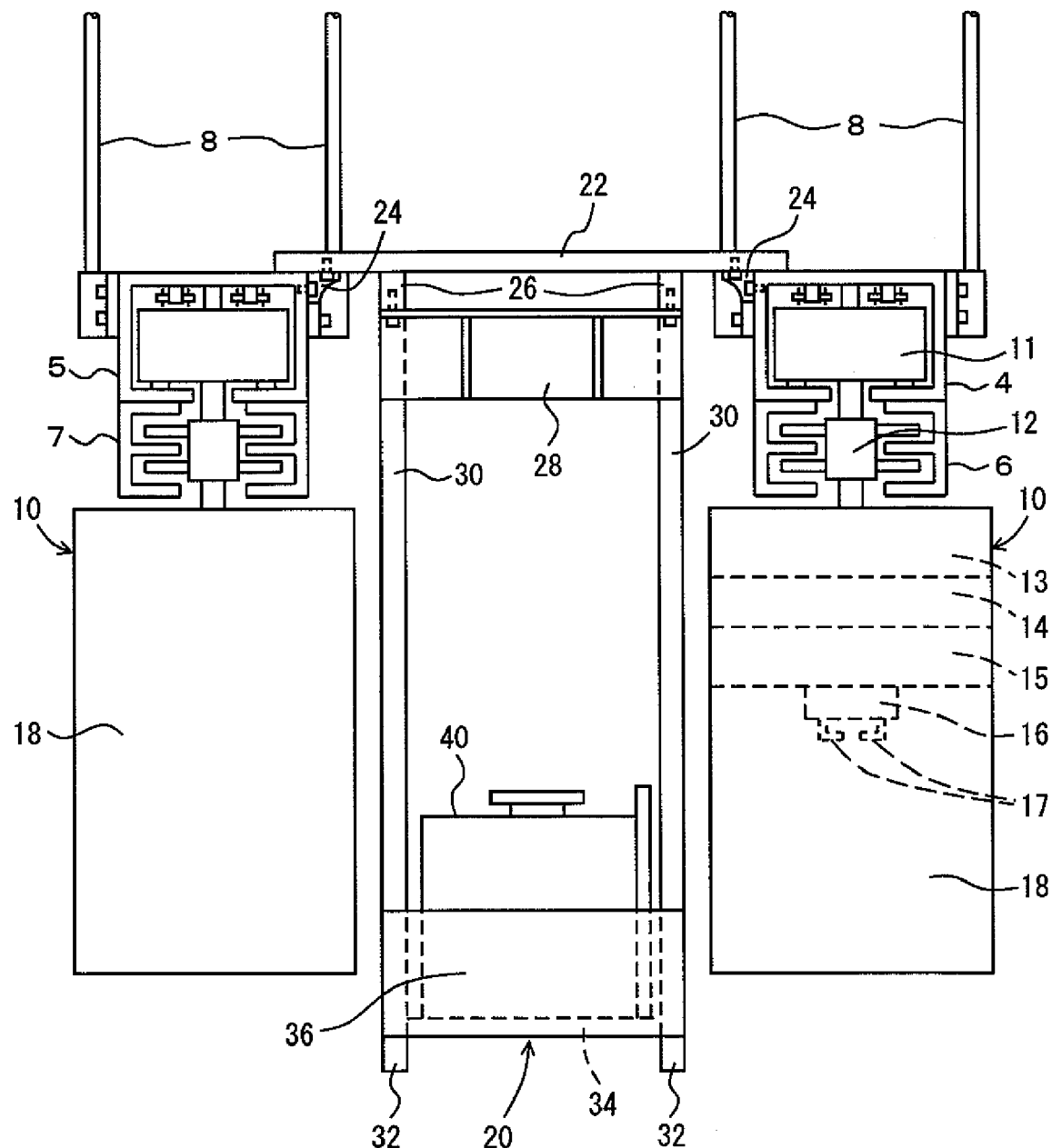

F I G. 2
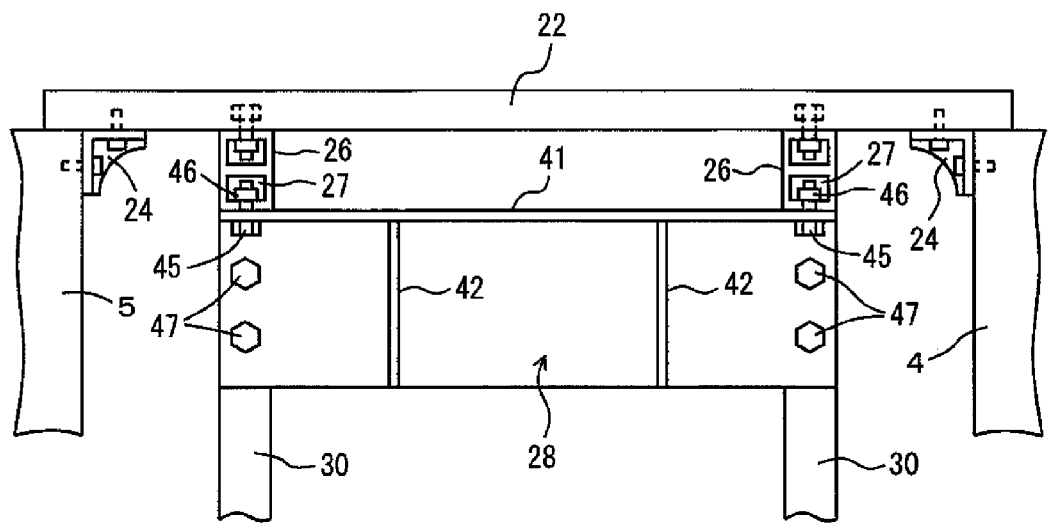
F I G. 3
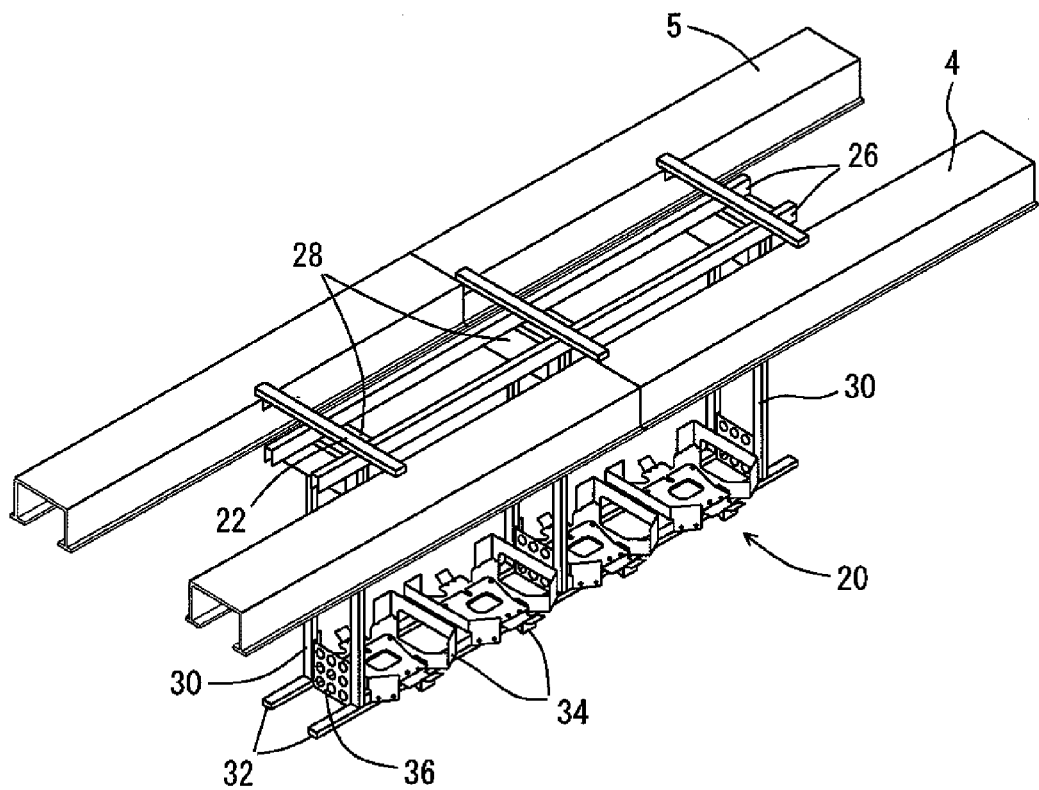

F I G. 4
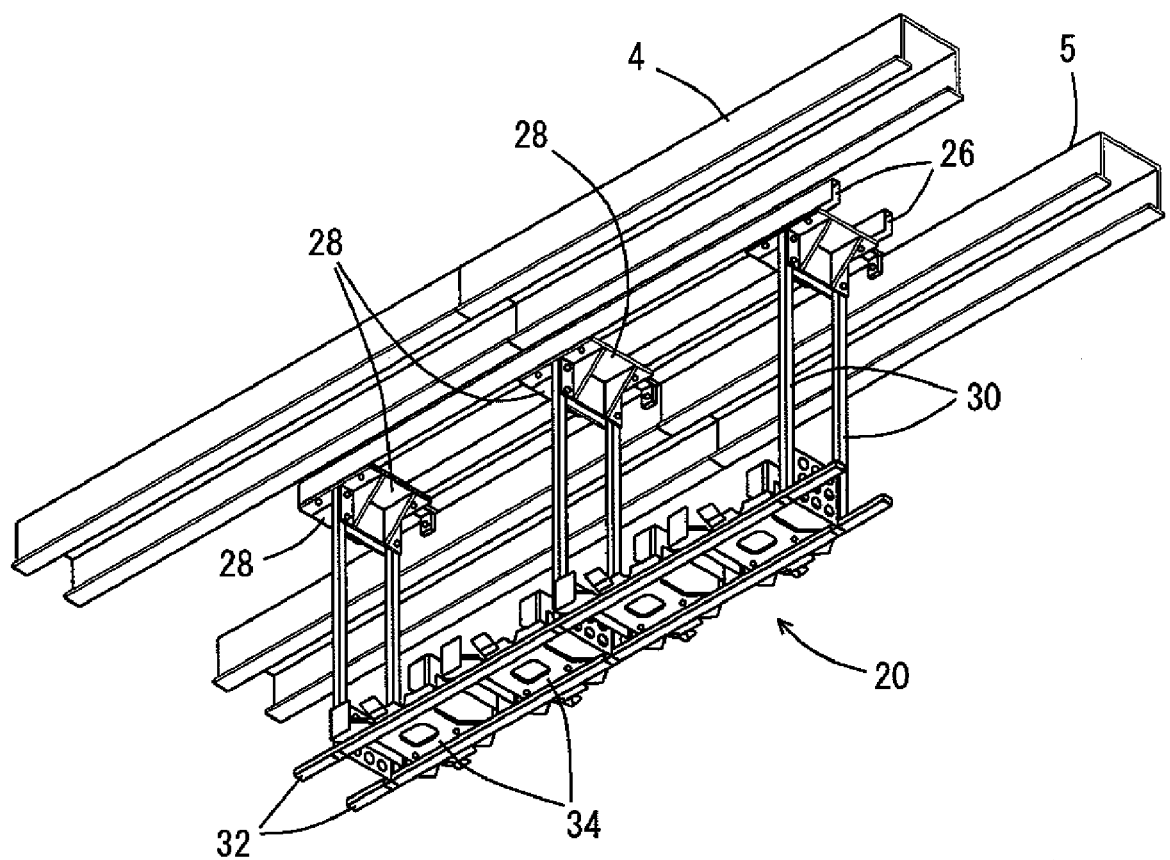

F I G. 6
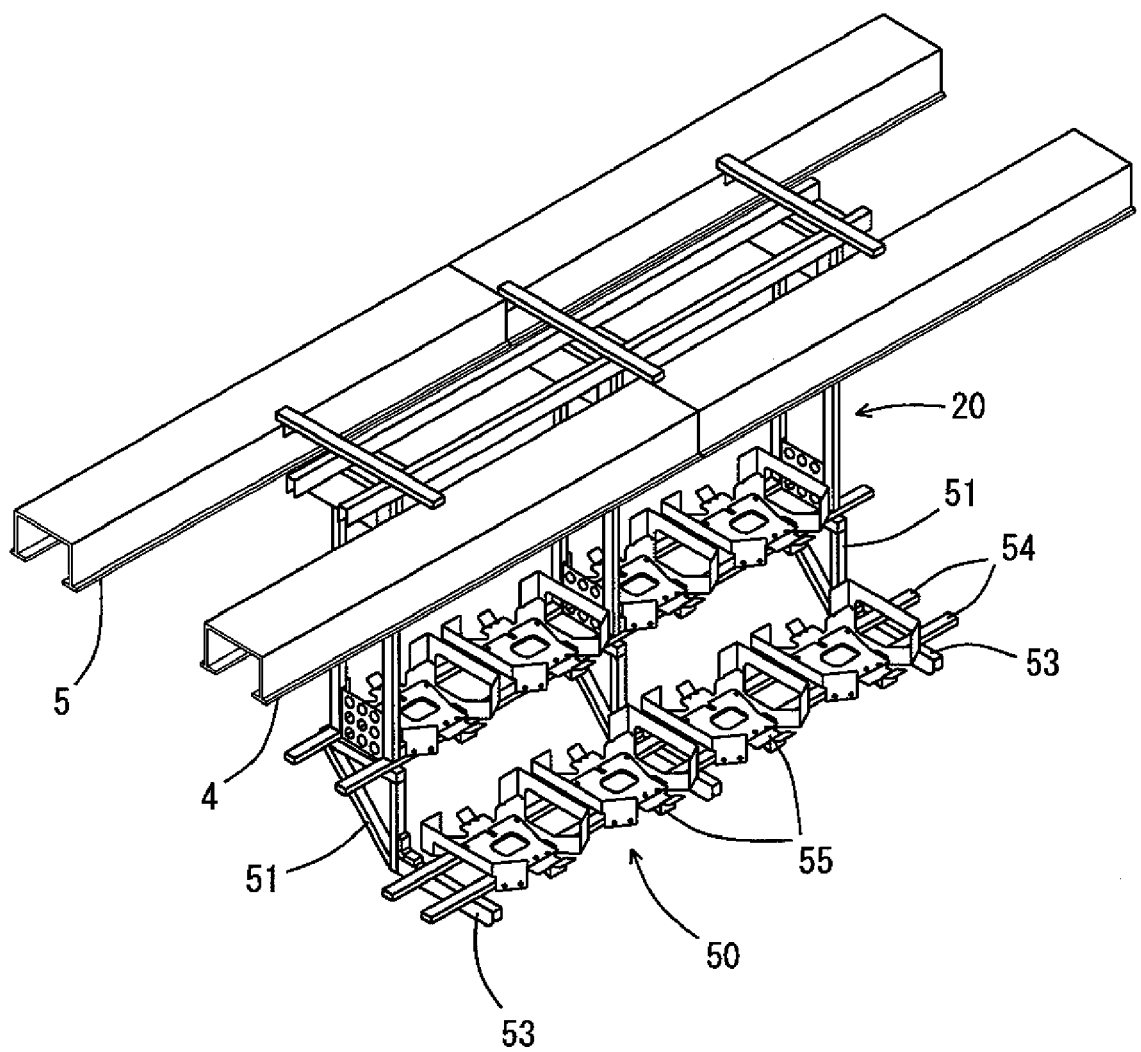

F I G. 7
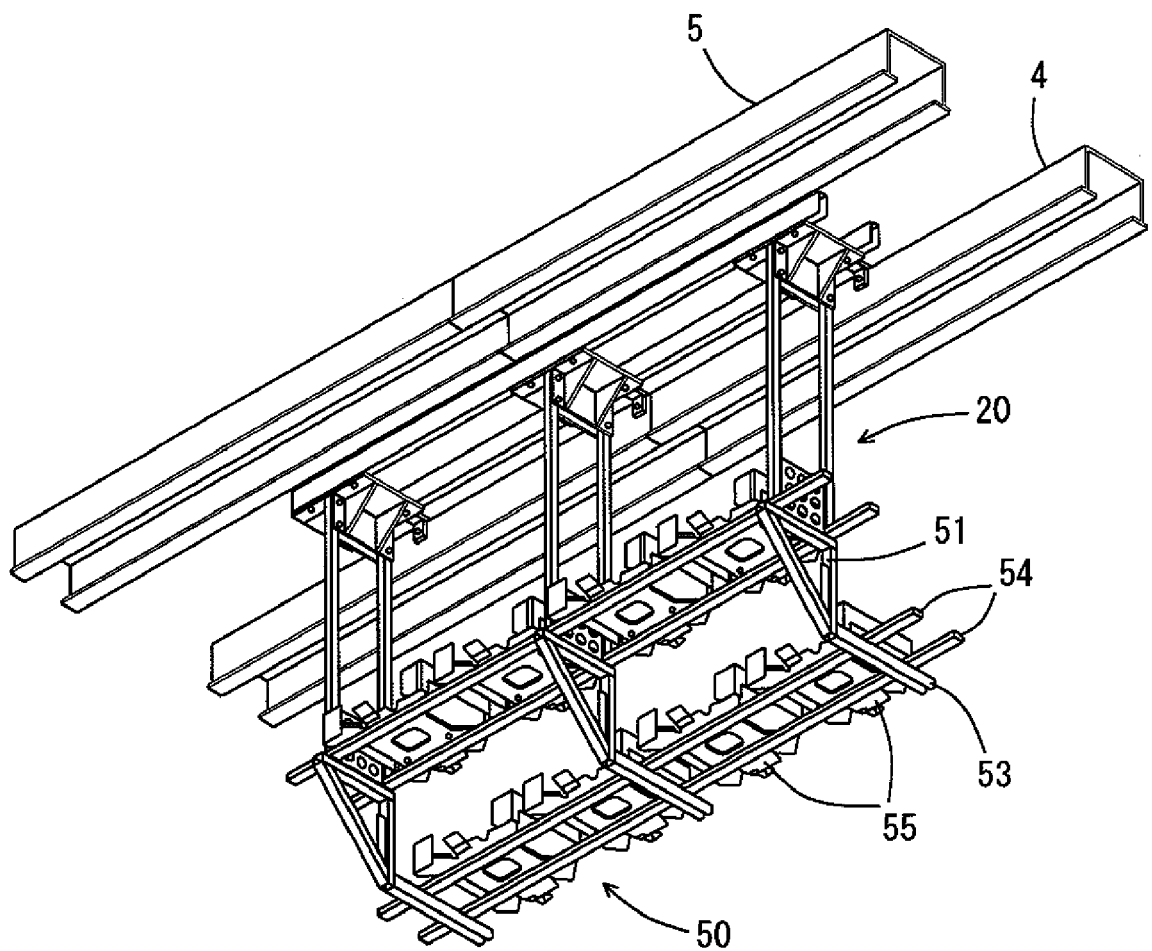

OVERHEAD TRAVELING VEHICLE SYSTEM AND CONSTRUCTION METHOD OF BUFFER IN THE SYSTEM

BACKGROUND OF THE INVENTION

1. Field of the Invention

The present invention relates to a construction of side buffers in an overhead traveling vehicle system.

2. Description of the Related Art

In an overhead traveling vehicle system, it is known to provide a side buffer beside a traveling rail in overhead traveling vehicles in order to receive and supply articles from and to the overhead traveling vehicles (See, for example, Japanese Laid-Open Patent Publication No. 2006-324469). Because the side buffer is hung from a ceiling of a clean room or the like through the use of hanger bolts or the like, construction of an overhead traveling vehicle system involves working in high places near to the ceiling. Additionally, if there are many side buffers, mounting of the hanger bolts requires many labor hours.

SUMMARY OF THE INVENTION

In order to overcome the problems described above, preferred embodiments of the present invention provide a way to make a construction of the side buffer easy while also reducing the required number of struts to be mounted to the ceiling. Preferred embodiments of the present invention also enable the construction of the side buffer and an under buffer easier to perform.

An overhead traveling vehicle system according to a preferred embodiment of the present invention is a system with an overhead traveling vehicle traveling along traveling rails hung from a ceiling and a side buffer provided beside the traveling rails to be able to supply and receive an article from and to the overhead traveling vehicle. The traveling rails are disposed parallel or substantially parallel to one another while being spaced from each other and the side buffer is disposed between the two traveling rails when viewed in a plan view, so as to be supported by the two traveling rails. While there are preferably two traveling rails, it should be noted that any number of traveling rails could be included in an overhead traveling vehicle system according to the preferred embodiments of the present invention.

Preferably, the side buffer includes a beam supported by the traveling rails, a raceway fixed to the beam that has a long groove that opens downward and is wider at its upper portion, a strut hung from the raceway, and a side buffer main body that is supported by the strut.

Particularly, it is preferable to further include a mounting member supported by the side buffer main body and extending downward from the side buffer main body and an under buffer main body supported under at least one of the two traveling rails by the mounting member.

A construction method of a buffer in an overhead traveling vehicle system according to a preferred embodiment of the present invention includes the steps of fixing traveling rails with a space between them by hanging them from a ceiling and disposing a side buffer between the two traveling rails so that the side buffer is supported by the two traveling rails in order to provide the side buffer in a system for traveling an overhead traveling vehicle along the traveling rail hung from a ceiling.

In the preferred embodiments of the present invention, the side buffer need not be hung from the ceiling. Therefore, it is possible to reduce the number of required mounting members, such as hanger bolts, and the like, and thus a mounting of the side buffer becomes easier.

When the side buffer is provided with the beam supported by two traveling rails, the raceway is fixed to the beam, the strut is hung from the raceway, and the side buffer main body is supported by the strut, it is possible to easily change a position of the side buffer main body by changing a position of the strut with respect to the raceway.

When the mounting member is supported by the side buffer main body and extends diagonally downward from the side buffer main body and the under buffer main body is supported under at least one of the traveling rails by the mounting member, it is possible to provide the under buffer through the side buffer. Moreover, because a position of the under buffer is determined by the side buffer, it becomes unnecessary to adjust the position of the under buffer.

Other features, elements, steps, characteristics and advantages of the preferred embodiments of the present invention will become more apparent from the following detailed description of preferred embodiments of the present invention with reference to the attached drawings.

BRIEF DESCRIPTION OF THE DRAWINGS

FIG. 1 is a front view of an essential portion of an overhead traveling vehicle system of a first preferred embodiment of the present invention.

FIG. 2 is a view showing mounting structures of struts of a side buffer to beams in the first preferred embodiment of the present invention.

FIG. 3 is a perspective view of the overhead traveling vehicle system of the first preferred embodiment of the present invention viewed diagonally from above.

FIG. 4 is a perspective view of the overhead traveling vehicle system of the first preferred embodiment of the present invention viewed diagonally from below.

FIG. 6 is a perspective view of the overhead traveling vehicle system of the second preferred embodiment of the present invention viewed diagonally from above.

FIG. 7 is a perspective view of the overhead traveling vehicle system of the second preferred embodiment viewed diagonally from below.

DETAILED DESCRIPTION OF PREFERRED EMBODIMENTS

Figure 5:
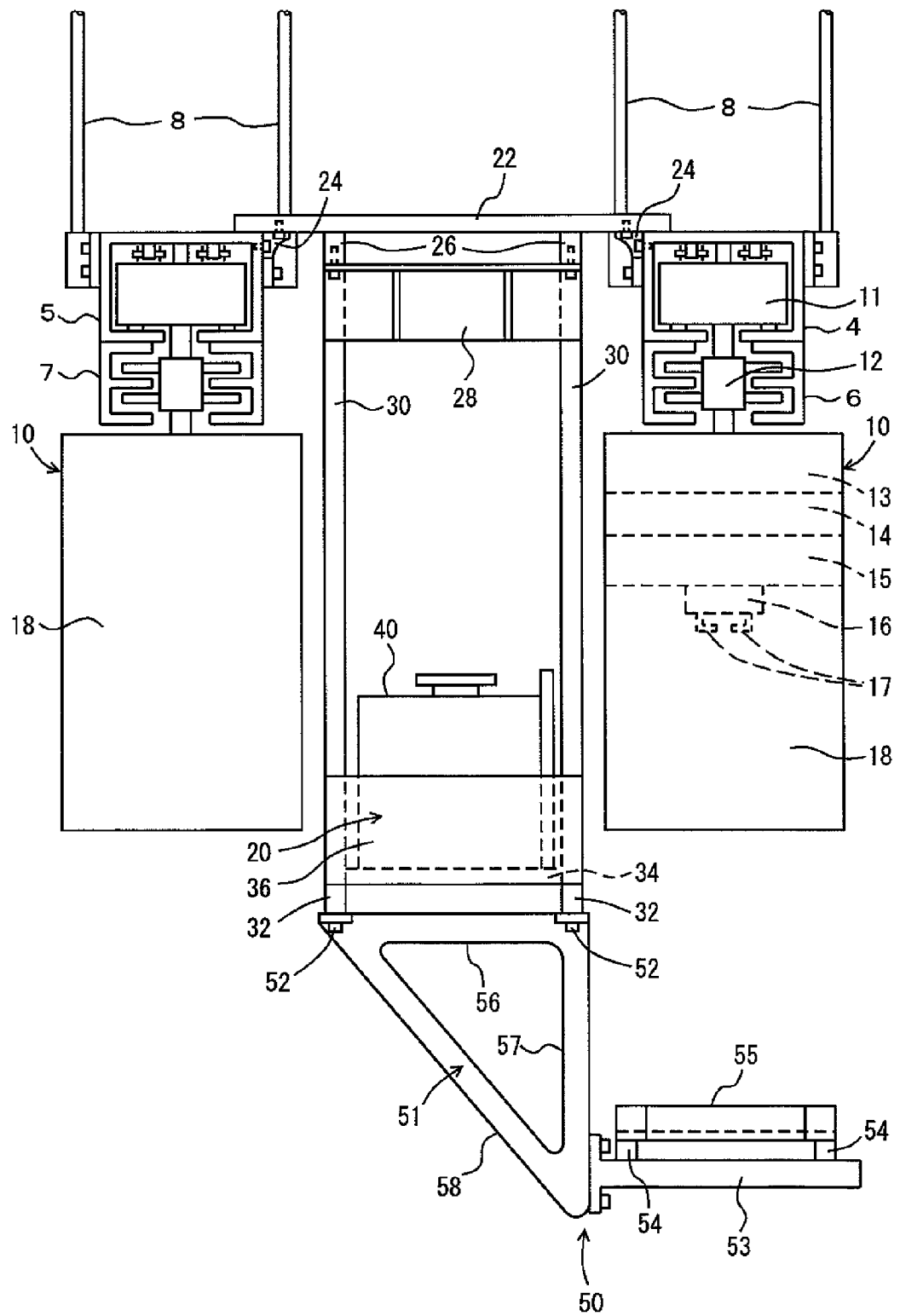
FIG. 5 is a front view of an essential portion of an overhead traveling vehicle system of a second preferred embodiment of the present invention.

FIGS. 1 to 7 show preferred embodiments of the present invention. In the drawings, a reference numeral 2 designates an overhead traveling vehicle system provided with a pair of traveling rails 4, 5 hung parallel or substantially parallel to and spaced from each other from a ceiling of a clean room and a pair of power feeding rails 6, 7 provided under the traveling rails 4, 5. A space between the traveling rails 4, 5 in a horizontal plane is uniform or substantially uniform and the traveling rails 4, 5 are parallel or substantially parallel in a plan view. The traveling rails 4, 5 are supported on the ceiling (not shown) of a room by hanger bolts 8. A reference numeral 10 designates an overhead traveling vehicle, 11 designates a traveling portion of the vehicle, 12 designates a power receiving portion, and 13 designates a lateral drive that moves a turning portion 14 and portions under it in a left-right direction of the traveling rails 4, 5. Here, the left-right direction refers to a direction perpendicular or substantially perpendicular to a traveling direction in the horizontal plane. The turning portion 14 turns an elevation drive 15, an elevation frame 16, and the like in the horizontal plane. The elevation drive 15 moves the elevation frame 16 up and down. A reference numeral 17 designates a chuck that grasps an article, such as a FOUP 40. A reference numeral 18 designates a cover provided to each of the front and rear of the overhead traveling vehicle 10 to prevent falling of the article.

A reference numeral 20 designates a side buffer that is provided in the space between the right and left traveling rails 4, 5. If three traveling rails are provided parallel or substantially parallel, it is possible to provide two lines of side buffers 20 between them. A reference numeral 22 designates beams that are fastened to the right and left traveling rails 4, 5 by bolts or the like with brackets 24 or the like disposed therebetween. Each of the beams 22 is provided with a pair of left and right raceways 26, for example, and left and right struts 30 are mounted to the raceways 26 by coupling fittings 28. Then, girders 32 are fixed to lower portions of the struts 30 and seats 34 on which the articles such as the FOUPs 40 are placed are mounted onto the girders 32. Along a traveling direction of the overhead traveling vehicle 10, side walls 36 are mounted to front and rear opposite ends of the side buffer 20. The side buffer 20, the girders 32, the seats 34 on the girders 32, and the side walls 36 are referred to as a side buffer main body. The side buffer main body is fixed to the raceways 26 by the struts 30 and the coupling fittings 28.

FIG. 2 shows the beam 22, the raceways 26, and members around them. The beam 22 is fixed to the traveling rails 4, 5 by the bolts or the like with the brackets 24 interposed therebetween. To support the beam 22 by the traveling rails 4, 5 also includes fixing of opposite ends of the beam 22 to the hanger bolts 8 for supporting the traveling rails 4, 5. The raceways 26 are long members having long grooves 27. Each of the long grooves 27 has a downward opening at a center of a bottom face of the raceway 26 and is wider at an upper portion of its opening. A nut 46 or the like is housed in the groove 27 and the coupling fittings 28 are mounted by using bolts 45 or the like. Furthermore, each of the struts 30 is fixed by bolts 47 or the like to sandwich the strut 30 between the pair of coupling fittings 28 provided in an inward direction of FIG. 2. As a result, the left and right struts 30 are fixed by the coupling fittings 28 and are mounted to the raceways 26. The coupling fittings 28 are provided with a horizontally extending mounting plate 41 and vertically extending reinforcing plates 42 and the bolts 45 or the like are mounted to the mounting plate 41.

FIGS. 3 and 4 show illustrations of the side buffer 20. The beams 22 are mounted to the right and left traveling rails 4 and 5 and the side buffer main body is mounted to the beams 22 with the raceways 26 and the coupling fittings 28 interposed therebetween. Accordingly, articles can be freely received and supplied from and to the overhead traveling vehicles traveling under the traveling rails 4, 5 to and from the seats 34. With reference to FIG. 1 again, the seats 34 are slightly lower than bottom surfaces of the articles such as FOUPs 40 transferred by the overhead traveling vehicles 10 traveling under the traveling rails 4, 5. Each of the overhead traveling vehicles 10 traveling under the right and left traveling rails 4, 5 laterally moves the turning portion 14, the elevation drive 15, and the elevation frame 16 with the lateral drive 13 to a position over the side buffer 20, moves the elevation frame up and down with the elevation drive 15, and actuates the chuck 17, to thereby receive and supply the articles from and to the seats 34 of the side buffer 20 to and from the overhead traveling vehicles 10.

Operation of a first preferred embodiment will be described. Because the side buffer 20 is supported by the right and left traveling rails 4, 5, it need not be mounted to the ceiling by hanger bolts 8 or the like. Therefore, it is possible to save labor hours required for mounting the hanger bolts 8 and costs of the hanger bolts 8. If the raceways 26 are fixed to the beams 22, an installed position of the side buffer 20 can be changed along the raceways 26. Moreover, the coupling fittings 28 and the struts 30 are mounted to the raceways 26. Therefore, it is possible to easily mount the struts 30 by using a stepladder or the like and working in high places is unnecessary as compared to mounting the struts 30 to the ceiling.

FIGS. 5 to 7 show a second preferred embodiment in which an under buffer 50 is further mounted to the side buffer 20. Reference numerals 51 designate mounting members that have, for example, triangular shapes each defined by three sides 56, 57, and 58 and each side 56 is fixed to the girders 32 by using bolts 52 or the like. Beams 53 are fixed to the mounting members 51. The mounting member 51 and the beam 53 may be formed integrally. Left and right girders 54 are disposed on the beams 53 and seats 55 are fixed onto the girders 54, 54. The seats 55 are directly under the traveling rail 4 or 5 and in such positions that the overhead traveling vehicle can receive and supply the articles by moving down the elevation frame 16. The beams 53, the girders 54, and the seats 55 form an under buffer main body. Although the under buffer 50 is provided under one of the right and left traveling rails 4, 5 in the second preferred embodiment, the under buffer 50 may be provided under each of the traveling rails 4, 5. Although it is inferior in mounting strength, the beams 53, the girders 54, and the seats 55 may be mounted by using L-shaped members that are the mounting members 51 without the sides 58. FIGS. 6 and 7 show illustrations of the side buffer 20 and the under buffer 50.

In the variation in FIGS. 5 to 7, the under buffer 50 can be mounted to the girders 32 at lower ends of the side buffer 20 and is easier to install when compared with a case where the under buffer is mounted directly to the ceiling or to the traveling rail 4 or 5. Furthermore, because the side buffer 20 is at a predetermined height with respect to the traveling rails 4, 5, the seats 55 are naturally in suitable positions for reception and supplying of the articles with respect to the traveling rails 4, 5 when the under buffer is mounted to the side buffer 20 with the mounting members 51 interposed therebetween. In other words, it is substantially unnecessary to adjust a position of the under buffer 50 in the vertical plane and in the horizontal plane.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. An overhead traveling vehicle system comprising:
at least two traveling rails disposed substantially parallel to one another while being spaced apart from each other;
a side buffer disposed between the at least two traveling rails in a plan view and supported by the at least two traveling rails; and
an overhead traveling vehicle arranged to travel along the at least two traveling rails hung from a ceiling and the side buffer provided adjacent to the at least two traveling rails to supply and receive an article from and to the overhead traveling vehicle, wherein
the side buffer includes:
beams supported by the at least two traveling rails;
raceways fixed to the beams and having grooves that open downward and are wider at an upper portion than at a lower portion;

struts hung from the raceways; and a side buffer main body supported by the struts.

2. The overhead traveling vehicle system according to claim 1, further comprising:

mounting members supported by the side buffer main body and extending downward from the side buffer main body; and an under buffer main body supported under at least one of the at least two traveling rails by the mounting members.

3. A method for constructing a side buffer in an overhead traveling vehicle system for supporting an overhead traveling vehicle along traveling rails hung from a ceiling with a side buffer, comprising the steps of:

fixing traveling rails with a space between them by hanging the traveling rails from a ceiling; and disposing and fixing the side buffer between the traveling rails in such a way that the side buffer is supported by the traveling rails; wherein the side buffer includes:

beams supported by the at least two traveling rails;

raceways fixed to the beams and having grooves that open downward and are wider at an upper portion than at a lower portion;

struts hung from the raceways; and a side buffer main body supported by the struts.

* * * * *